(12) United States Patent
Lee et al.

(10) Patent No.: US 7,190,111 B2
(45) Date of Patent: Mar. 13, 2007

(54) ORGANIC ELECTROLUMINESCENT DEVICE EMPLOYING MULTI-LAYERED ANODE

(75) Inventors: Kwanhee Lee, Seoul (KR); Hyuneok Shin, Gunpo (KR); Yongjoong Choi, Seoul (KR); Janghyuk Kwon, Suwon (KR); Jinwoung Jung, Suwon (KR)

(73) Assignee: Samsung SDI Co., Ltd., Suwon-si (KR)

( * ) Notice: Subject to any disclaimer, the term of this patent is extended or adjusted under 35 U.S.C. 154(b) by 229 days.

(21) Appl. No.: 10/385,453

(22) Filed: Mar. 12, 2003

(65) Prior Publication Data
US 2003/0234608 A1 Dec. 25, 2003

(30) Foreign Application Priority Data
Jun. 22, 2002 (KR) ................. 2002-35137

(51) Int. Cl.
  *H05B 33/22* (2006.01)
  *H05B 33/24* (2006.01)
  *H05B 33/26* (2006.01)
  *H01L 51/50* (2006.01)
  *H05B 33/00* (2006.01)

(52) U.S. Cl. ............... 313/503; 313/504; 313/506
(58) Field of Classification Search ........... 313/504, 313/506; 257/40; 427/66
See application file for complete search history.

(56) References Cited

U.S. PATENT DOCUMENTS

| | | | |
|---|---|---|---|
| 5,714,838 A | 2/1998 | Haight et al. | |
| 5,796,509 A | 8/1998 | Doany et al. | |
| 6,016,033 A | 1/2000 | Jones et al. | |
| 6,166,488 A * | 12/2000 | Arai | 313/504 |
| 6,366,017 B1 * | 4/2002 | Antoniadis et al. | 313/506 |
| 6,501,217 B2 * | 12/2002 | Beierlein et al. | 313/504 |
| 6,608,449 B2 * | 8/2003 | Fukunaga | 315/169.3 |
| 6,680,570 B2 * | 1/2004 | Roitman et al. | 313/506 |
| 6,831,408 B2 * | 12/2004 | Hirano et al. | 313/504 |
| 2005/0031901 A1 * | 2/2005 | Lee et al. | 313/503 |

FOREIGN PATENT DOCUMENTS

| | | | |
|---|---|---|---|
| EP | 845924 A2 * | 6/1998 | |
| JP | 10069984 A * | 3/1998 | |
| JP | 10308285 A * | 11/1998 | |
| WO | 99/39393 | 8/1999 | |
| WO | WO 2004049465 A2 * | 6/2004 | |

OTHER PUBLICATIONS

Official English translation of foreign patent to Takahata et al. (JP 10-308285 A).*

(Continued)

*Primary Examiner*—Mariceli Santiago
(74) *Attorney, Agent, or Firm*—Stein, McEwen & Bui, LLP (57) ABSTRACT

An organic electroluminescent (EL) device includes a substrate, a first anode formed on the substrate with a reflectivity of 60% or higher, a second anode formed on the first anode, wherein the second anode includes a conductive metal or an oxide thereof having a work function of 4.3 to 5.8 eV, an organic layer formed on the second anode, and a cathode formed on the organic layer.

19 Claims, 8 Drawing Sheets

OTHER PUBLICATIONS

Official English translation of foreign patent to Koike et al. (JP 10-069984 A).*

24.4L: Late-News Paper: A 13.0-inch AM-OLED Display with Top Emitting Structure and Adaptive Current Mode Programmed Pixel Circuit (TAC); Tatsuya Sasaoka, Mitsunobu Sekiya, Akira Yumoto, Jiro Yamada, Takashi Hirano, Yuichi Iwase, Takao Yamada, Tadashi Ishibashi, Takao Mori, Mitsuru Asano, Shinichiro Tamura and Tesuo Urabe; Organic El Development Department, Core Technology & Network Company, Sony Corporation; pp. 003-006.

* cited by examiner

ORGANIC ELECTROLUMINESCENT DEVICE EMPLOYING MULTI-LAYERED ANODE

CROSS-REFERENCE TO RELATED APPLICATIONS

This application claims the benefit of Korean Patent Application No. 2002-35137 filed Jun. 22, 2002, in the Korean Intellectual Property Office, the disclosure of which is incorporated herein by reference.

BACKGROUND OF THE INVENTION

1. Field of the Invention

The present invention relates to an organic electroluminescent (EL) device employing a multi-layered anode, and more particularly, to an organic EL device having improved emission efficiency by employing a multi-layered anode having good reflectivity and high hole injecting efficiency.

2. Description of the Related Art

An organic EL device is generally constructed such that a hole injection electrode is arranged on a substrate, e.g., a glass substrate, organic layers for emitting light are stacked on the hole injection electrode, and an electron injection electrode is stacked on the organic layers. An active matrix (AM) drive type organic EL device is constructed such that a thin film transistor is arranged on a substrate, and a hole injection electrode, organic layers and an electron injection electrode are sequentially stacked thereon.

When the stacked organic EL device is a rear emitting type, light is emitted from a transparent substrate. In an EL device having a built-in pixel driver circuit, since a wide area of a substrate is occupied by the pixel driver circuit, a light emitting area, i.e., an aperture ratio, is sharply reduced. Such a reduction in aperture ratio increases current density, which may adversely affect performance of an organic EL device.

To solve the above-described problems, a front emitting type organic EL device has been proposed. In the case of the front emitting type organic EL device, a wide area may be used as a light emitting area irrespective of an area occupied by a thin film transistor circuit.

An example of a conventional organic EL device of a reflection type is disclosed in U.S. Pat. No. 5,796,509, in which a light emitting film which emits light by an electronic signal is disposed between two electrodes, that is, a transparent electrode and a patterned reflective electrode, the light emitted from the light emitting film passing through the transparent electrode to display an image, and the light emitted toward the reflective electrode being reflected to the patterned reflective electrode to display an image.

U.S. Pat. No. 6,016,033 discloses an organic EL device having a substrate, a first conductive layer formed on the substrate, an organic emission layer formed on the first conductive layer, a second conductive layer formed on the organic emission layer, and a barrier layer between the first and second conductive layers. In the disclosed organic EL device, the first conductive layer serves as both an electron injection layer and a reflection layer. The second conductive layer serves as a hole injection layer.

U.S. Pat. No. 5,714,838 discloses an organic EL device having a cathode and an anode sequentially formed on a substrate, an organic layer disposed between the cathode and the anode and emitting light according to voltage application, and a barrier layer interposed between the organic layer and an adjacent electrode. In the organic EL device, the cathode has a low work function and a good electron injection capability, and the anode and the barrier layer have a high work function and a good hole injection capability. In an embodiment of the disclosed patent, an anode made of, for example, ITO or Al is formed on an opaque substrate, e.g., a silicon substrate, and a cathode is formed using a transparent material such as ZnS, GaN, ITO or ZnSe.

The use of Al for forming an anode greatly increases a driving voltage, making it difficult to be used in an organic EL device in practice.

A top-emitting structure has been proposed to maximize an aperture ratio and improve emission efficiency (SID Digest pp 384–386, Title: "A 13.0-inch AMOLED display with top emitting structure adaptive current mode programmed pixel circuit"). According to the technique, a front-emitting organic EL device includes a stacked structure in which a reflective anode, a hole transport layer, an emission layer, an electron transport layer and a semi-transparent cathode are sequentially stacked, and the light from the emission layer is emitted through the semi-transparent cathode to drive the device. Pure R, G and B color emissions produced from such a structure are subjected to multiple interference due to partial reflectance occurring at the semi-transparent anode. Optimization of such a multi-layered structure improves color coordinate characteristics.

As the reflective anode, a single metal layer is used. The use of the single metal layer as an anode reduces the reflectivity of the anode to less than 60%, deteriorating a utilization efficiency of emitted light, resulting in a rise in driving voltage, and lowering a lifetime of the device.

As described above, the conventional methods of fabricating a front-emitting organic EL device, have several problems. That is, since the reflectivity of an anode is not taken into consideration, or a single metal layer used as a reflective layer has low reflectivity, about half of the light emitted from an organic emission layer cannot be efficiently utilized and is lost. In particular, use of Al in fabricating an anode disadvantageously lowers the driving voltage of the device, making it difficult to actually employ the Al anode in an organic EL device.

SUMMARY OF THE INVENTION

To overcome the problems, the present invention provides a front-emitting organic EL device with improved emission efficiency by employing a multi-layered anode having high reflectivity while being capable of easily injecting holes.

The present invention also provides a front-emitting organic EL device of an active matrix drive type, with improved emission efficiency, by employing a multi-layered anode having high reflectivity while being capable of easily injecting holes.

According to an aspect of the present invention, an organic EL device may include a substrate, a first anode formed on the substrate with a reflectivity of 60% or higher, a second anode formed on the first anode and made of a conductive metal or an oxide thereof having a work function of 4.3 to 5.8 eV, an organic layer formed on the second anode, and a cathode formed on the organic layer. In the organic EL device, a third anode made of a conductive metal or an oxide thereof having a work function of 4.3 to 5.8 eV may be further provided between the substrate and the first anode.

The first anode may comprise a material selected from the group consisting of Al, Al alloy, Ag, Ag alloy and alloys of these materials, and the second or third anode may comprise a material selected from the group consisting of ITO (indium tin oxide), IZO (indium zinc oxide) Ni, Pt, Au, Ir, Cr, Ag and oxides thereof.

The first anode may be formed of Al, and the second and third anodes may be formed of Ni. Also, the first anode may be formed of Al, and the second anode may be formed of Ni. Alternatively, the first anode may be formed of Ag, and the second and third anodes may be formed of ITO or IZO.

The cathode may comprise at least one material selected from the group consisting of Li, Ca, LiF/Ca, LiF/Al, Al, Mg, Mg alloy, ITO, and IZO.

The organic layer includes at least one selected from the group consisting of a hole injection layer, a hole transport layer, an emission layer, a hole barrier layer, an electron transport layer and an electron injection layer.

According to another aspect of the present invention, an organic EL device of an active matrix drive type may include a substrate, a thin film transistor formed on the substrate, an insulator layer formed on the thin film transistor, a first anode connected to source/drain electrodes of the thin film transistor through a via hole of the insulator layer and having a reflectivity of 60% or higher, a second anode formed on the first anode and made of a conductive metal or an oxide thereof having a work function of 4.3 to 5.8 eV, an organic layer formed on the second anode, and a cathode formed on the organic layer. In the organic EL device, a third anode made of a conductive metal or an oxide thereof having a work function of 4.3 to 5.8 eV may be further provided between the substrate and the first anode.

Alternatively, an organic EL device of an active matrix drive type may include a substrate, a thin film transistor formed on the substrate, an insulator layer formed on the thin film transistor, a third anode connected to source/drain electrodes of the thin film transistor through a via hole of the insulator layer and made of a conductive metal or an oxide thereof having a work function of 4.3 to 5.8 eV, a first anode formed on the third anode and having a reflectivity of 60% or higher, a second anode formed on the first anode and made of a conductive metal having a work function of 4.3 to 5.8 eV or an oxide thereof, an organic layer formed on the second anode, and a cathode formed on the organic layer.

Additional aspects and advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the embodiments, taken in conjunction with the accompanying drawings of which:

FIGS. 2A through 2C illustrate a method of fabricating the organic EL device shown in FIG. 1A, and FIGS. 2D through 2G illustrate a method of fabricating the organic EL device shown in FIG. 1B;

DETAILED DESCRIPTION OF THE PREFERRED EMBODIMENTS

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

An organic EL device according to the present invention is a front-emitting type in which emitted light is transmitted to the front surface of the device, rather than to the rear surface with a low aperture ratio, to realize an image display. In such an organic EL device, a conductive metal or the conductive metal's alloy capable of easily injecting electrons, or a low-resistance transparent electrode is used as a cathode, and a multi-layered electrode having a conductive metal or the conductive metal's oxide layer formed of the conductive metal or the conductive metal's alloy capable of easily injecting electrons, and a reflective layer with a high reflectivity formed between the conductive metal or the conductive metal's oxide layer and the substrate, is used as an anode. The multi-layered structure may be formed by simultaneous etching, to serve as both a reflective layer and an anode, and to minimize a galvanic phenomenon.

The anode of the present invention has a bilayer structure comprising a first anode (reflective layer) and a second anode (conductive metal or the conductive metal's oxide layer), or a trilayer structure comprising a third anode (conductive metal or the conductive metal's oxide layer), a first anode (reflective layer) and a second anode (conductive metal or the conductive metal's oxide layer). Here, the first anode has a reflectivity of 60% or higher, more specifically 60 to 99.9%, and the second and third anodes are made of a conductive metal or its oxide having a work function of 4.3 to 5.8 eV so as to achieve easy hole injection. If a work function of the conductive metal or its oxide is less than 4.3 eV, hole injection capability is reduced.

In particular, the anode of the present invention is preferably a bilayer structure of Al/Ni or a trilayer structure of Ni/Al/Ni. As described above, a multi-layered structure is formed using Al and Ni in fabricating the anode to produce an organic EL device having desirable characteristics in view of driving voltage, resistance and reflectivity. In the above-described organic EL device, since film formation is simplified and multiple layers constituting the anode can be simultaneously etched, the manufacturing process is also simplified. Also, since contact between metal to form source/drain electrodes of a thin film transistor and the anode is active, the source/drain electrode structure is so straightforward that the source/drain electrodes may be formed of Al only.

In the organic EL device according to the present invention, total reflectivity of an anode is 60% or higher, preferably 85% or higher, and most preferably 85 to 99.9%.

The organic EL device and a method for manufacturing the same according to the present invention will now be described in detail.

Figure 1A:
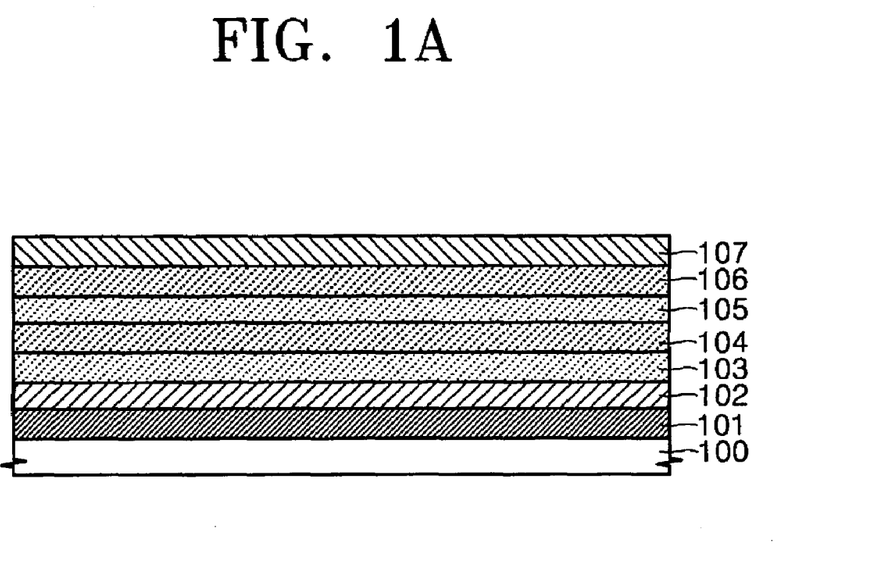
FIGS. 1A and 1B are cross-sectional views of an organic EL device according to an embodiment of the present invention.

FIG. 1A is a cross-sectional view of an organic EL device according to an embodiment of the present invention.

Referring to FIG. 1A, a multi-layered anode is formed on a substrate 100. The multi-layered anode has a first anode 101 comprising a metal having a high reflectivity and a second anode 102 made of a conductive metal or the conductive metal's oxide having a work function of 4.3 to 5.8 eV, sequentially stacked. The metal forming the first anode 101 is a metal having a reflectivity of 60 to 99.9%, for example, Al, Al alloy, Ag, Ag alloy, or alloys of these materials. In particular, Al is preferably used in view of etching.

The thickness of the first anode 101 is preferably 50 to 300 nm.

The second anode 102 is made of a conductive metal or the conductive metal's oxide having a high work function of 4.3 to 5.8 eV and capable of easily injecting holes, for example, ITO, IZO, Ni, Pt, Au, Ir, Cr, or Ag.

The thickness of the second anode 102 is preferably 3 to 30 nm. If the thickness of the second anode 102 is greater than 30 nm, it is difficult to etch simultaneously the first electrode and the second electrode. If the thickness of the second anode 102 is less than 3 nm, hole injection is difficult.

A hole transport layer 103 is formed on the second anode 102, and an emission layer 104, an electron transport layer 105, an electron injection layer 106 and a cathode 107 are sequentially stacked on the second anode 102.

Although not shown in FIG. 1, an encapsulation layer is formed on the cathode 107 for encapsulation. In general, the encapsulation may be performed by attaching glass or transparent plastic to the substrate using an adhesive agent such as an epoxy adhesive agent or a silicon adhesive agent.

In one embodiment of the present invention, a protective layer is selectively formed between the cathode 107 and the encapsulation layer. Here, the protective layer prevents external moisture or $O_2$ gas from infiltrating into the device, thus preventing deterioration of the device and protecting internal organic layers. Examples of protective layer materials include $Y_2O_3$, $SiO_2$, $Si_3N_4$, $SiN_xO_y$, and the like.

Examples of hole transporting materials for forming the hole transport layer 103 include N,N'-di(naphthalene-1-yl)-N,N'-diphenyl-benzidine (α-NPB), N,N'-bis(3-methylphenyl)-N,N'-diphenyl-(1,1'-biphenyl)-4,4'-diamine (TPD) and the like. The thickness of the hole transport layer 103 is in a range of 10 to 50 nm. If the thickness of the hole transport layer 103 is outside the above range, hole injecting properties deteriorate to undesirable levels.

In addition to the hole transporting materials, the hole transport layer 103 may further include a dopant capable of emitting light to an electron-hole connection. Examples of the dopant include 4-(dicyanomethylene)-2-t-butyl-6-(1,1,7,7-tetramethyljulolidyl-9-enyl)-4H-pyran (DCJTB) having a formula below, Coumarin 6, Rubrene, DCM, DCJTB, Perylene, Quinacridone and the like, and is contained in an amount of 0.1 to 5 wt % based on the total weight of the hole transporting material. Addition of a dopant allows emission colors to be adjustable according to a kind and amount of the dopant added, and improves thermal stability of the hole transport layer to increase a lifetime of the device.

DCJTB

A hole injection layer may also be provided between the hole transport layer 103 and the second anode 102. Formation of the hole injection layer reduces contact resistance between the second anode 102 and the hole transport layer 104, and improves a hole transporting capability of the anode to the emission layer (or electron transport layer), thus improving the overall performance of the device.

As materials for the hole injection layer, starburst amine compounds are used. The thickness of the hole injection layer is in the range of 30 to 100 nm. If the thickness of the hole injection layer is outside the above range, hole injecting properties are poor.

Examples of the material for the emission layer 104 of the present invention include, but are not limited to, CBP(4,4'-bis(carbazol-9-yl)-biphenyl).

CBP

Like the hole transport layer 103, the emission layer 104 of the present invention may further include a dopant capable of emitting light to an electron-hole connection. The kind and amount of dopant in the emission layer 104 are substantially the same as the kind and amount of dopant in the hole transport layer 103. In the present invention, examples of the dopant include IrPPy3{tris(phenylpyridine) Iridium} having the following formula:

IrPPy3

The thickness of the emission layer 104 is preferably in the range of 10 to 40 nm.

In the present invention, without separately forming the emission layer, only the electron transport layer is formed and the electron transport layer may also serve as an emission layer.

Examples of electron transporting materials for the electron transport layer 105 include tris(8-quinolinolate)-aluminum (Alq$_3$) and Almq$_3$, having the formulas shown below, respectively. A dopant may be capable of emitting light to an electron-hole connection. The kind and amount of the dopant in the electron transport layer are substantially the same as the kind and amount of dopant in the hole transport layer 103. The thickness of the electron transport layer 105 is preferably in a range of 30 to 100 nm. If the thickness of the electron transport layer 105 is outside the above range, the efficiency of the device is lowered and the driving voltage thereof increases, which are both undesirable.

A hole barrier layer (HBL) may further be formed between the emission layer 104 and the electron transport layer 105. Here, the HBL prevents excitons generated from a phosphorescent material from migrating to the electron transport layer 105 or prevents holes from migrating to the electron transport layer 105. BAlq may be used as a material for forming the HBL.

The electron injection layer 106 on the electron transport layer 105 may be formed of a material made of LiF, and the thickness thereof is preferably in the range of 0.1 to 10 nm. If the thickness of the electron injection layer 106 is outside the above range, the driving voltage increases to an undesirable level.

The cathode layer 107 on the electron injection layer 106 may include a transmissive cathode that is formed after forming a semi-transmissive cathode, or by directly forming a transmissive cathode. In the former case, a semi-transmissive cathode is formed using a low work function metal, e.g., Li, Ca, LiF/Ca, LiF/Al, Al, Mg, or Mg alloy, and then a layer having a low resistance, e.g., ITO or IZO (Indium Zinc Oxide), is further formed. In the latter case, a transmissive cathode is formed using a low resistance material or a work function suitable for serving as a cathode, e.g., ITO or IZO (Indium Zinc Oxide). The thickness of the semi-transmissive cathode is preferably in the range of 5 to 30 nm. If the thickness of the semi-transmissive cathode is less than 5 nm, electron injection does not occur properly at a low driving voltage. If the thickness of the semi-transmissive cathode is greater than 30 nm, the transmittance is noticeably reduced, which is undesirable. The overall thickness of the semi-transmissive cathode and transmissive cathode is preferably in the range of 10 to 400 nm.

The substrate 10 is a substrate that is used in a general organic EL device, e.g., a glass substrate or a transparent plastic substrate having good transparency, surface evenness, manageability and being waterproof. The thickness of the substrate 10 is preferably in the range of 0.3 to 1.1 mm.

Figure 1B:
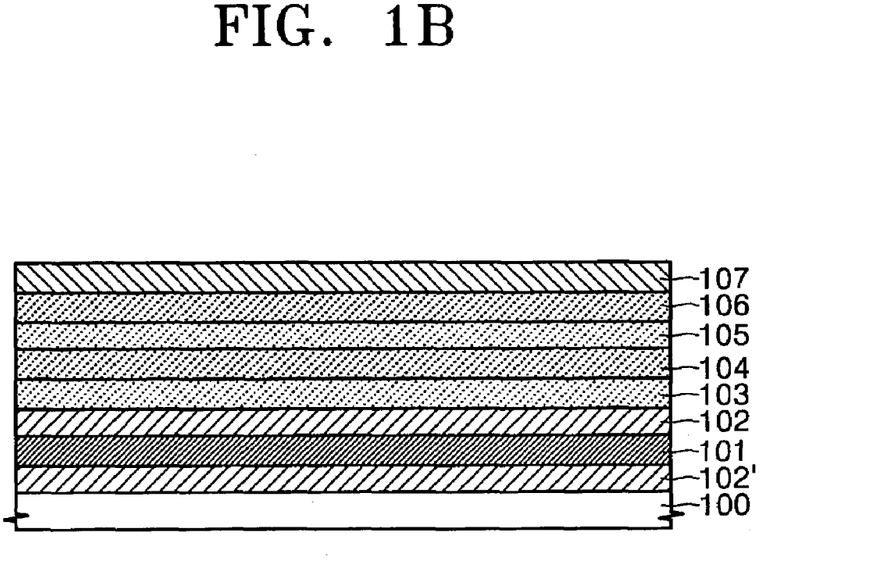

FIG. 1B is a cross-sectional view of an organic EL device according to another embodiment of the present invention. The organic EL device shown in FIG. 1B, compared to that shown in FIG. 1A, has a stacked structure in which a third anode 102' is further formed between the first anode 101 and the substrate 100. Here, the third anode 102' is a hole injection electrode and is formed of a material that is also used for forming the second anode 102. The thickness of the third anode 102' is in the same range as the second anode 102.

In the organic EL device shown in FIG. 1, the second anode 102 or the third anode 102' is formed of a material capable of easily injecting holes and having a work function of 4.3 to 5.8 eV, for example, ITO, IZO, Ni, Pt, Au, or Ir.

In the bilayer anode of the present invention, it is preferable that the first anode 101 is formed of Al or Ag, and the second anode 102, as a hole injection electrode, is formed of Ni. In the case of a trilayer anode, the second anode 102 and the third anode 102' are preferably formed of Ni and the first anode 101 is preferably formed of Al or Ag.

As described above, the Al/Ni bilayer anode and Ni/Al/Ni trilayer anode have the following advantages. In general, in order for a thin metal film to have good transmittance, the thin film must have low electric conductivity. Thus, a material useful for a semi-transmissive cathode must have lower electric conductivity than Al. The electrical conductivity of Ni, used in the bilayer or trilayer anode, is approximately $1.43 \times 10^5/\Omega$-cm, which is approximately 2.5 times smaller than the electrical conductivity of Al, that is, $3.65 \times 10^5/$-cm. Thus, even when the overall thickness of the anode is in the range of 50–100 Å, light transmissivity of the anode is high enough to utilize reflectivity of an Al layer disposed under an Ni layer, and resistance can be further reduced by forming the Al layer under the Ni layer. Also, since Al is more oxidative than Ni, Al, can prevent oxidation of the Ni layer by an electrochemical reaction.

Figure 2:
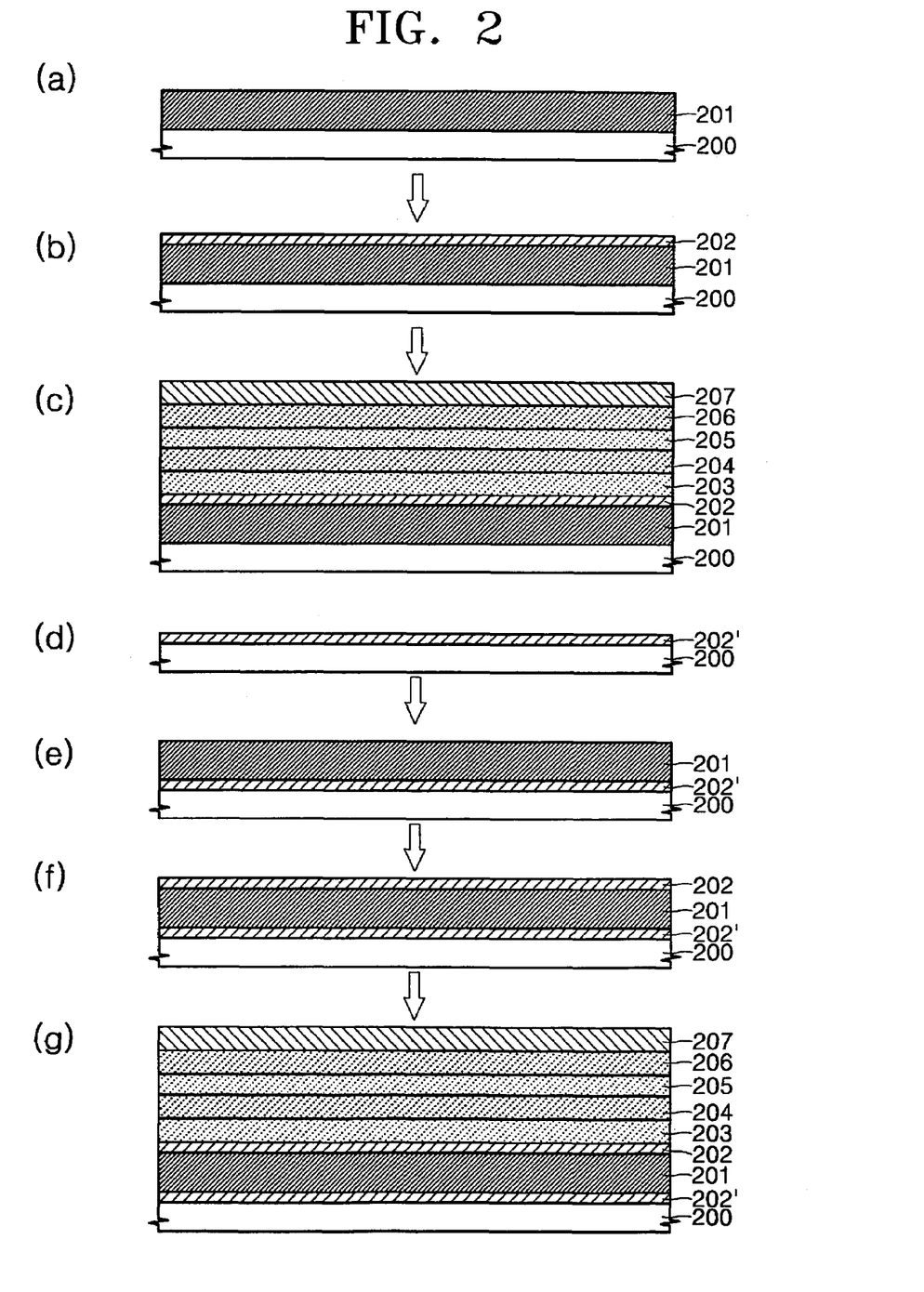

FIGS. 2A through 2C illustrate a method of fabricating an organic EL device having a bilayer anode shown in FIG. 1A. Referring to FIG. 2A, a first anode 201 is formed as a reflective metal layer on a substrate 200 by sputtering. Then, a second anode 202 is formed on the first anode 201 by continuous sputtering deposition (FIG. 2B). If an anode is formed by continuous sputtering deposition, a film material of the anode becomes dense, interface characteristics between the first anode 201 and the second anode 202 are improved, and hole injection is promoted.

Various processing conditions for sputtering will now be described. First, the power for a sputter is in the range of 0.1 to 4 $W/cm^2$, and sputtering gas and inert gas include, but not limited to, Ar, He, Ne, Kr, Xe or mixtures thereof. The pressures of these gases during sputtering are in the range of 0.1 to 20 Pa.

After forming the bilayer anode in the above-described manner, the resulting anode is subjected to simultaneous etching using an Al etchant to pattern the anode.

Then, an organic layer is stacked on the patterned anode. In an embodiment of the present invention, the organic layer includes at least one layer selected from the group consisting of a hole injection layer, a hole transport layer, a hole barrier layer, an electron transport layer and an electron injection layer. Referring to FIGS. 2A through 2C, the organic layer is formed by sequentially stacking a hole transport layer 203, an emission layer 204, an electron transport layer 205 and an electron injection layer 206. The hole transport layer 203, the emission layer 204, the electron transport layer 205 and the electron injection layer 206 may be formed by a conventional method of forming an organic layer of an organic EL device, preferably thermal evaporation. Then, a cathode 207 is formed on the organic layer by thermal evaporation or sputtering (FIG. 2C).

An encapsulation layer (not shown) may be formed on the cathode 207. Here, encapsulation may be performed by attaching glass or transparent plastic to the substrate 200 using an adhesive agent such as an epoxy adhesive agent or silicon adhesive agent, by UV curing or thermal curing.

When a protective layer is further formed between the cathode 207 and the encapsulation layer, the protective layer may be formed by sputtering or E-beam.

FIGS. 2D through 2G illustrate a method of fabricating an organic EL device having a trilayer anode shown in FIG. 1B. A third anode 202' is formed on a substrate 200 by sputtering (FIG. 2D). Then, a first anode 201 is formed on the third anode 202' by continuous sputtering deposition (FIG. 2E). Next, a second anode 202 is formed on the resultant structure (FIG. 2F).

Thereafter, an organic layer is formed by the same method as in FIG. 2C, thereby completing the organic EL device shown in FIG. 1B (FIG. 2G).

Figure 3A:
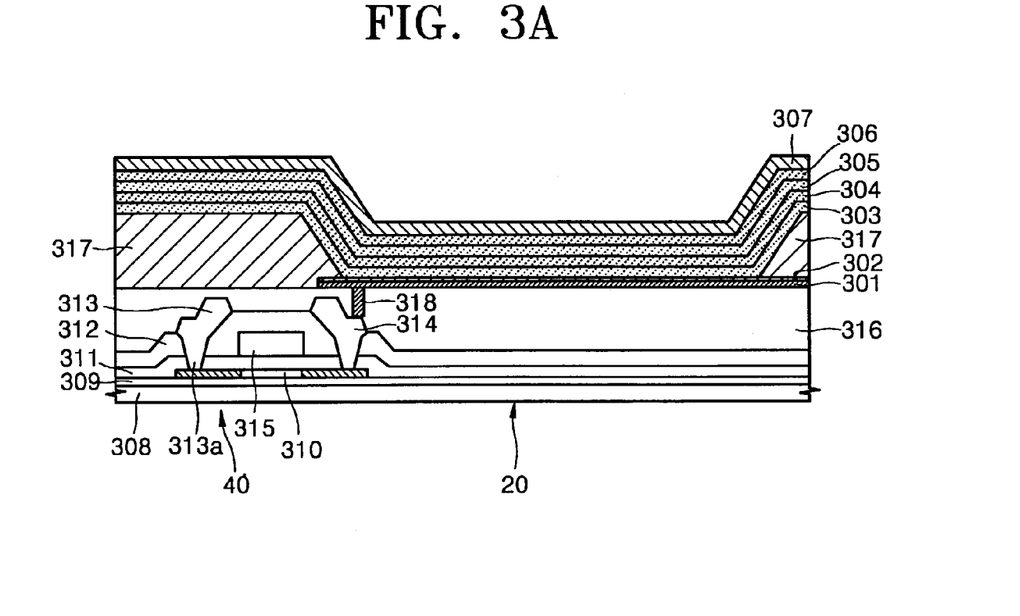
FIGS. 3A and 3B are cross-sectional views of an active matrix drive type organic EL device according to an embodiment of the present invention.
Figure 3B:
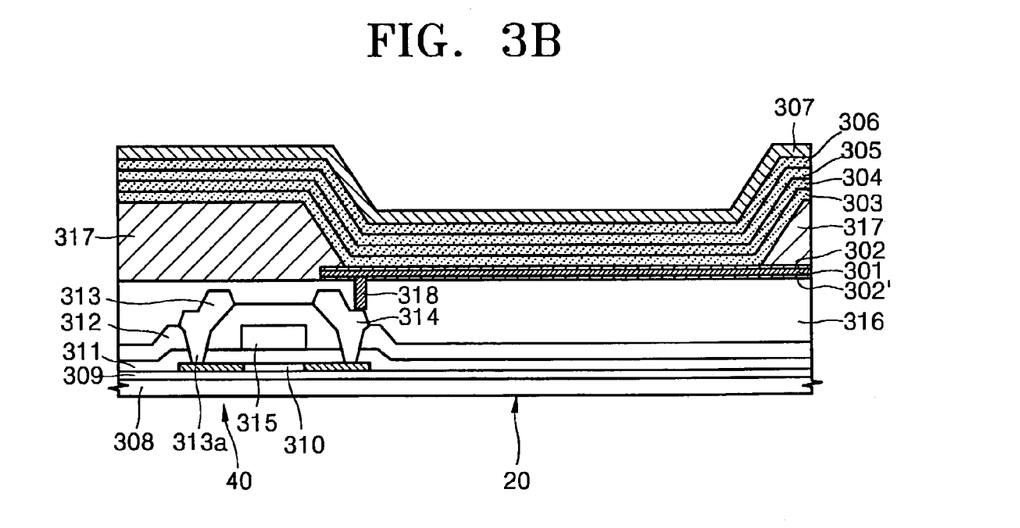

FIGS. 3A and 3B are cross-sectional views of an active matrix drive type organic EL device having a thin film transistor according to an embodiment of the present invention. The organic EL device includes a pixel area 20 wherein an image is displayed, and a driver area 40 for driving the pixel area 20.

Referring to FIG. 3A, the pixel area 20 includes a transparent substrate 308 and a plurality of insulator layers stacked on the transparent substrate 308. The plurality of insulator layers include a buffer insulator layer 309, an intermediate insulator layer 311, an interlayer insulator layer 312 and a planarization layer 316 sequentially stacked.

A panel (pixel) including an anode, an organic layer and a cathode is arranged on the planarization layer 316. In more detail, a first anode 301 and a second anode 302 are sequentially formed, and then a hole transport layer 303, an emission layer 304, an electron transport layer 305, a hole injection layer 306 and a cathode 307 are sequentially formed thereon. The hole transport layer 303, the emission layer 304, the electron transport layer 305, the hole injection layer 306 and the cathode 307 are connected to the driver area 40, as shown in FIG. 3A.

The driver area 40 has a thin film transistor arranged for active driving. That is, a buffer layer 309 is formed on the transparent substrate 308, and a semiconductor layer 310 is formed thereon. The semiconductor layer 310 is formed of polysilicon.

A gate electrode 315 is arranged above the semiconductor layer 310 to correspond thereto. An interlayer insulator layer 312 covering the gate electrode 315, a source electrode 313, and a drain electrode 314 are formed at opposite sides of the semiconductor layer 310 through a contact hole 313a, respectively.

The planarization layer 316 is formed over the source electrode 313 and the drain electrode 314. The first anode 301 of the pixel area 20 is electrically connected to the drain electrode 314 through a via hole 318. The via hole 318, although not shown in detail, may have a dual layer structure in which materials for forming the first anode 301 and the second anode 302 are packed.

Referring to FIG. 3B, a third anode 302' is formed under the first anode 301, and the third anode 302' of the pixel area 20 and the drain electrode 314 of the driver area 40 are electrically connected to each other through the via hole 318.

In the organic EL device shown in FIGS. 3A and 3B, the via hole 318, although not shown in detail, may have a triple layer structure in which materials for forming the first anode 301, the second anode 302 and the third anode 302' are packed.

The organic EL device according to the present invention can solve a connection problem between source/drain electrodes of a thin film transistor constituting a driver area and an anode of a pixel area by connecting the source/drain electrodes to the anode.

Figure 4A:
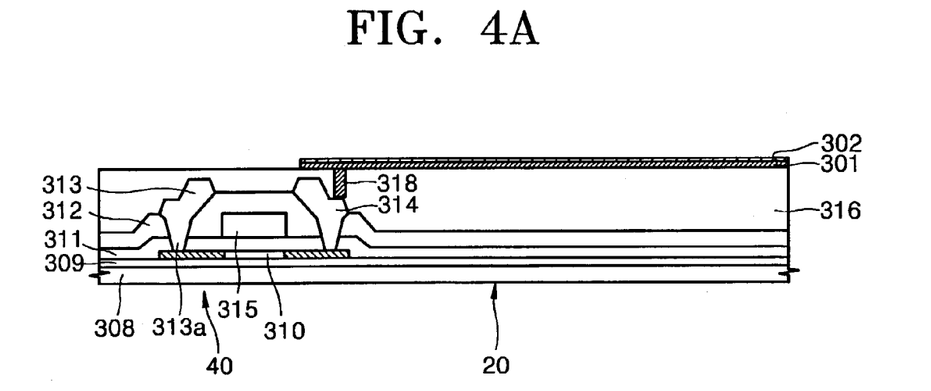
FIGS. 4A through 4C illustrate a method of fabricating the organic EL device shown in FIG. 3A, and FIGS. 4D through 4F illustrate a method of fabricating the organic EL device shown in FIG. 3B.
Figure 4B:
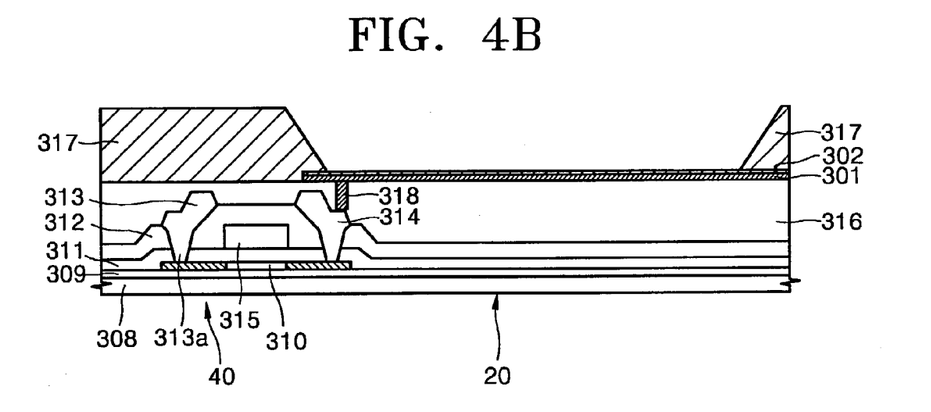
Figure 4C:
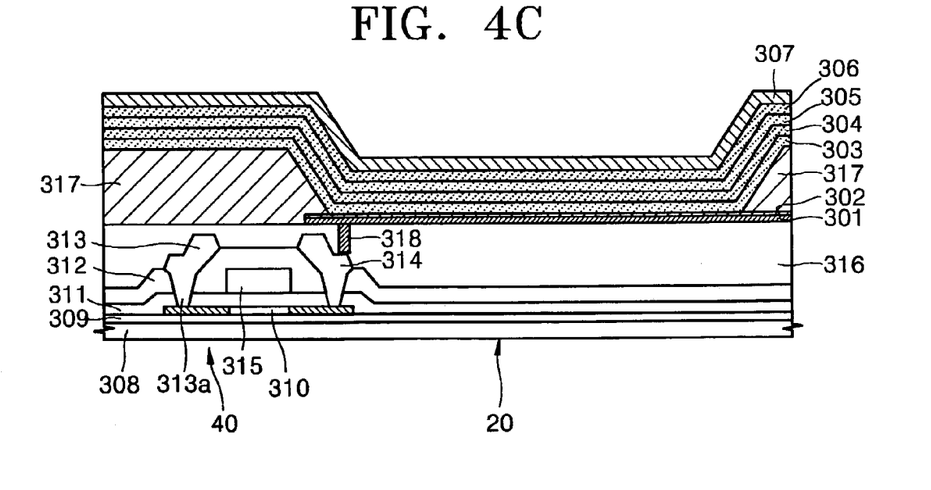

FIGS. 4A through 4C illustrate a method of fabricating the organic EL device of an active drive type shown in FIG. 3A. As shown in FIG. 3A, a thin film transistor is formed by a conventional method. Then, a bilayer anode, that is, an anode consisting of a first anode 301 and a second anode 302, is formed on a planarization layer 316 where the thin film transistor having a via hole 318 is formed (FIG. 4A).

The bilayer anode, including the first anode 301 and the second anode 302, is formed by sputtering. Various processing conditions for sputtering will now be described. First, the power for a sputter is in the range of 0.1 to 4 $W/cm^2$, and sputtering gas and inert gas include, but are not limited to, Ar, He, Ne, Kr, Xe or mixtures thereof. The pressures of these gases during sputtering are in the range of 0.1 to 20 Pa.

Next, an insulator layer 317 is formed on the second anode 302 (FIG. 4B). Here, as a material for forming the insulator layer 317, any material capable of insulating pixels from each other may be used, and examples include an acryl-based resin or phenol-based resin.

Then, an organic layer is formed on the resultant product by a general method. Here, the organic layer is formed by sequentially stacking a hole transport layer 302, an emission layer 304, an electron transport layer 305 and an electron injection layer 306. Thereafter, a cathode 307 is formed on the organic layer (FIG. 4C).

In the above-described method, the bilayer anode structure, consisting of the first anode 301 and the second anode 302, may be patterned by simultaneous etching to simplify the process. When the anodes are simultaneously etched as described above, wet etching or dry etching may be employed.

When the respective anodes forming the bilayer anode structure are simultaneously etched by wet etching, a galvanic phenomenon may occur due to an electrochemical reaction. The galvanic phenomenon may be avoided by performing dry etching or by using a trilayer anode having a reflective layer. A trilayer anode having a high-precision reflective layer may be formed by simultaneous etching using dry etching. The anode with a reflective layer may be patterned in a different manner according to patterning of a thin film transistor (TFT).

Figure 4D:
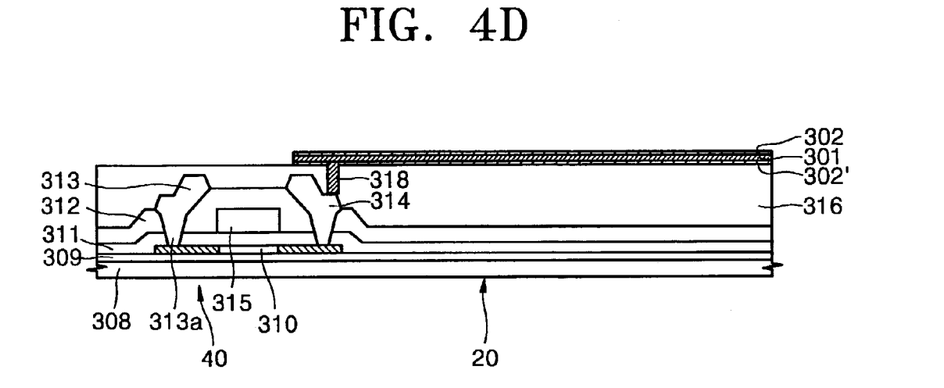
Figure 4E:
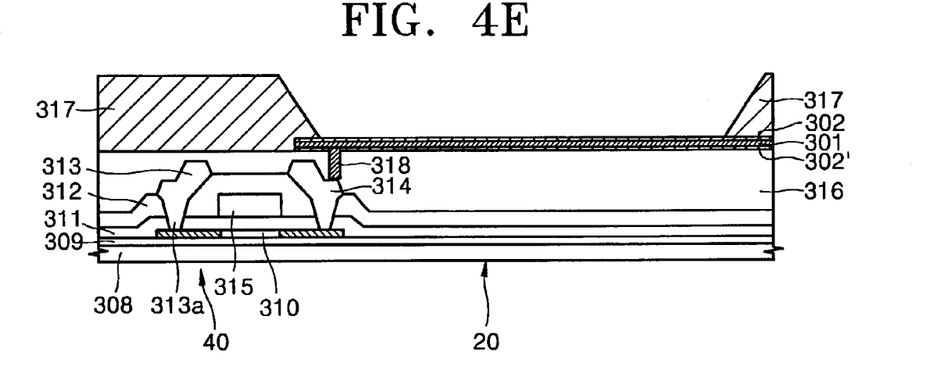
Figure 4F:
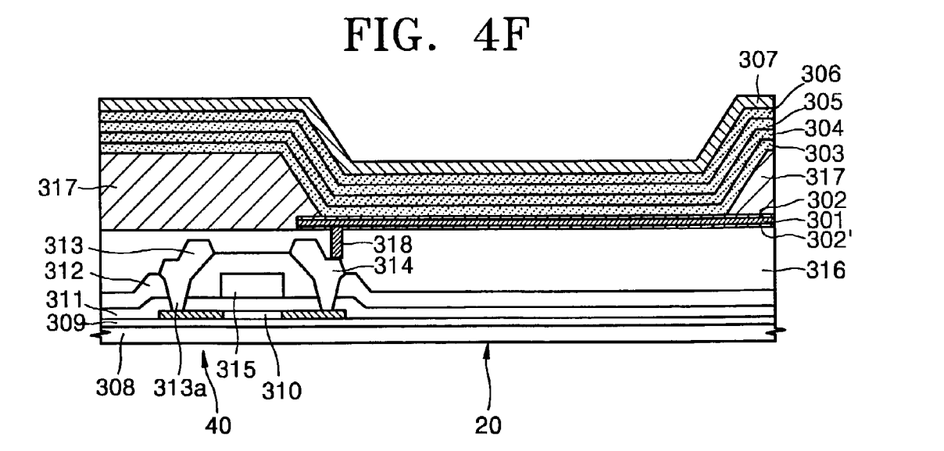

FIGS. 4D through 4F illustrate a method of fabricating the organic EL device shown in FIG. 3B. As shown in FIG. 3B, the same process as shown in FIGS. 4A through 4C is performed except that a third anode 302', a first anode 301 and a second anode 302 are sequentially stacked on a TFT having a via hole 318 by sputtering to form a trilayer anode, thus obtaining the organic EL device shown in FIG. 3B.

The present invention will be further described with reference to the following examples; however, it should be noted that the present invention is not restricted by these examples.

EXAMPLE 1

Ni was sputtered onto a glass substrate to a thickness of 75 Å at 0.7 KW under 2 mmtorr using an RF sputter to form a third anode. Then Al was sputtered onto the third anode at 4 KW under 4 mmtorr using a DC sputter to form a first anode having a thickness of 1800 Å. Ni was sputtered onto the first anode to a thickness of 75 Å at 0.7 KW under 2 mmtorr using an RF sputter to form a second anode.

Subsequently, an aqueous solution of HCl was sprayed onto the resultant product as an Al etchant, followed by simultaneous etching at 40° C., thereby forming a patterned anode.

In order to form an insulator layer on the patterned anode, a 2 mm×2 mm emission area pattern was formed. Subsequently, the resultant product was cleaned using water, isopropyl alcohol and acetone, respectively, and was further cleaned using an UV/$O_3$ cleaner.

Thereafter, IDE 406 (manufactured by IDEMITSU KOSAN LTD.) was vacuum-deposited on the second anode of the resultant product to form a hole injection layer having a thickness of 50 nm. Subsequently, NPB was vacuum-deposited on the hole injection layer at a rate of 0.1 nm/sec, to form a hole transport layer having a thickness of 15 nm.

Thereafter, CBP and IrPPy$_3$, mixed in a weight ratio of 100:5, were thermally evaporated on the electron transport layer to form an emission layer having a thickness of 25 nm.

Then, BAlq was deposited on the emission layer to form a hole barrier layer (HBL) having a thickness of 10 nm. Alq$_3$ was vacuum-deposited on the HBL to form an electron transport layer having a thickness of 40 nm.

Mg and Ag, mixed in a weight ratio of 10:1, were thermally evaporated on the electron transport layer to form a cathode having a thickness of 10 nm. Subsequently, ITO was deposited on the cathode using a sputter at a rate of 0.2 nm/sec under $1\times10^{-5}$ Pa to form a transmissive cathode and a protective layer.

Next, encapsulation was performed using glass and an UV adhesive agent under an anhydrous, nitrogen gas atmosphere, followed by thermally curing at approximately 70° C. for about 1 hour, thus completing a front-emitting organic EL device.

EXAMPLE 2

The same procedure as Example 1 was performed, except that a thickness of a third anode was 100 Å, a thickness of a second anode was 1800 Å, and a thickness of a first anode was 100 Å, thus completing a front-emitting organic EL device.

EXAMPLE 3

Al was sputtered onto a glass substrate to a thickness of 1800 Å at 4 KW under 4 mmtorr using a DC sputter to form a first anode. Then, Ni was sputtered onto the third anode at 0.7 KW under 2 mmtorr using an RF sputter to form a second anode having a thickness of 75 Å, thus forming a bilayer anode. Thereafter, the same procedure as Example 1 was performed, thus completing a front-emitting organic EL device.

COMPARATIVE EXAMPLE 1

The same procedure as Example 1 was performed, except that a cathode was formed by depositing Ca to a thickness of 10 nm, and a trilayer anode was formed by the following method, thus completing a front-emitting organic EL device.

Al was sputtered onto a glass substrate at 4 KW under 4 mmtorr using a DC sputter to form an Al layer having a thickness of 180 nm. A photoresist layer was deposited on the resultant product, followed by exposure, development, etching and ashing, thus forming a patterned Al layer. Subsequently, $SiO_2$ was sputtered to a thickness of 100 nm to form a $SiO_2$ layer. Next, a photoresist layer was deposited on the resultant product, followed by exposure, development, etching and ashing, thus forming a patterned $SiO_2$ layer.

Thereafter, ITO was sputtered onto the $SiO_2$ layer to form an ITO layer, and a photoresist layer was deposited thereon, followed by exposure, development, etching and ashing, thus forming a patterned ITO layer.

Figure 5A:
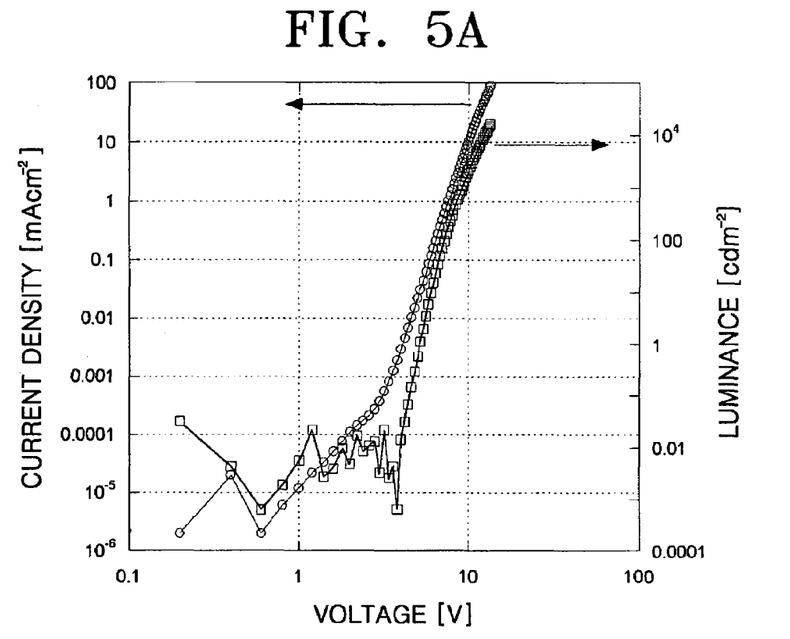
FIGS. 5A and 5B show current-voltage-luminance characteristics and efficiency-luminance characteristics of an organic EL device prepared in Example 1 of the present invention.
Figure 5B:
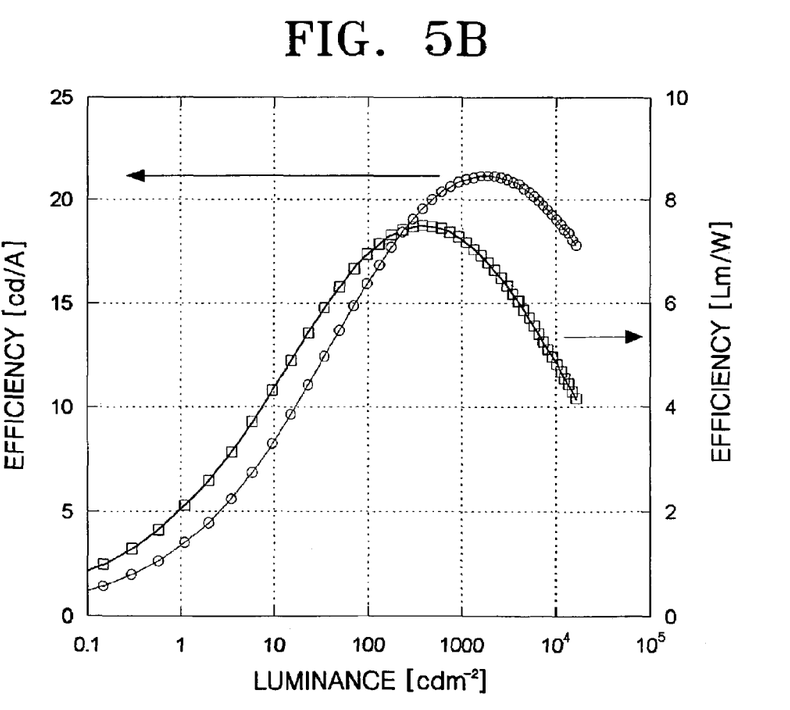

The current-voltage-luminance and efficiency-luminance characteristics of the organic EL device formed in Example 1 were examined, and the results are shown in FIGS. 5A and 5B and Table 1.

TABLE 1

|  | Efficiency (cd/A) | Luminance (nit) | Voltage (V) |
| --- | --- | --- | --- |
| Ni(75 Å)/Al(1800 Å)/ | 15 | 100 | 7 |
| Ni(75 Å) | 20 | 500 | 7.9 |
|  | 21 | 1000 | 9.0 |

Referring to Table 1 and FIGS. 5A and 5B, the organic EL device having a trilayer anode showed high efficiency and a high driving voltage.

Figure 6A:
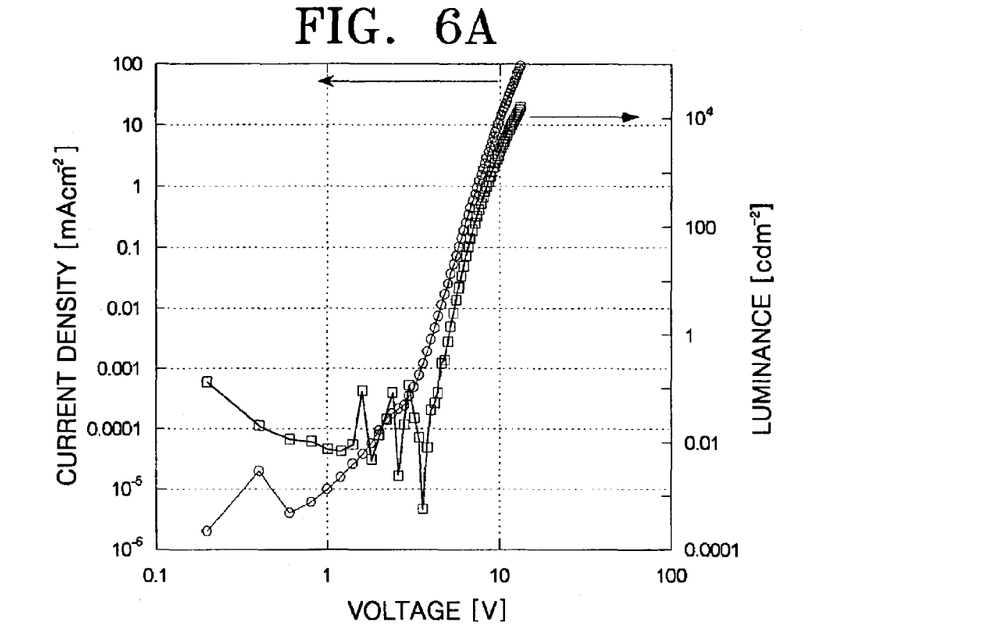
FIGS. 6A and 6B show current-voltage-luminance characteristics and efficiency-luminance characteristics of an organic EL device prepared in Example 2 of the present invention.
Figure 6B:
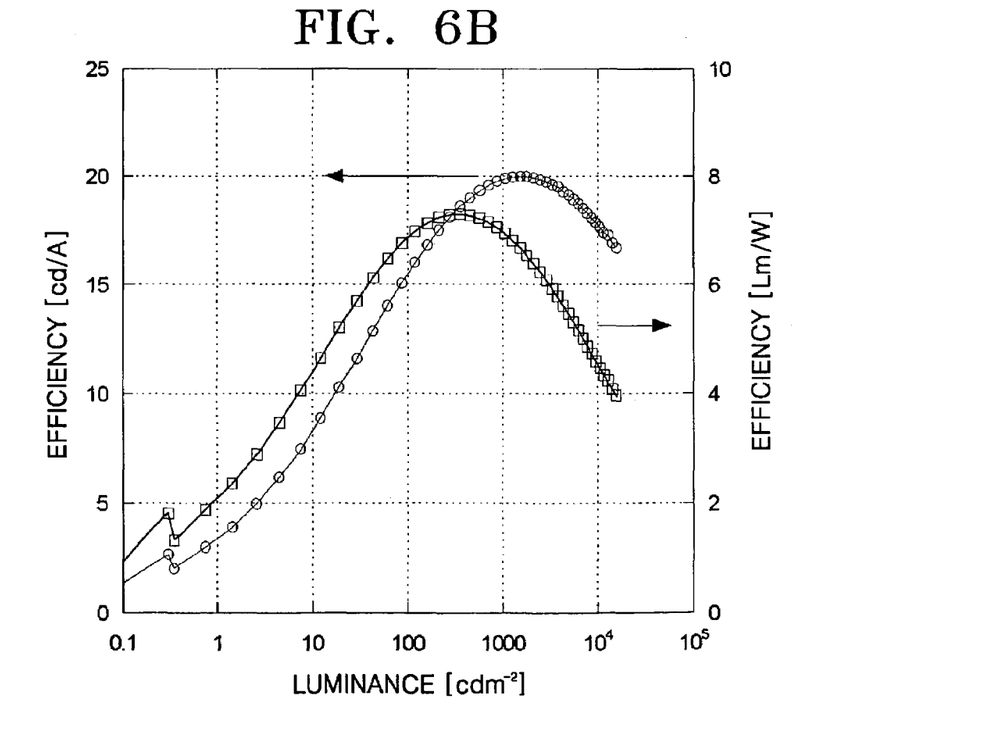

The current-voltage-luminance and efficiency-luminance characteristics of the organic EL device formed in Example 3 were examined, and the results are shown in FIGS. 6A and 6B and Table 2.

TABLE 2

|  | Efficiency (cd/A) | Luminance (nit) | Voltage (V) |
| --- | --- | --- | --- |
| Al(1800 Å)/ | 13 | 100 | 7 |
| Ni(75 Å) | 19 | 500 | 8.2 |
|  | 20 | 1000 | 9.1 |

Referring to Table 2 and FIGS. 6A and 6B, the organic EL device having a bilayer anode showed high efficiency and a high driving voltage, and there was little difference in performance between the organic EL device having a trilayer anode and the organic El device having the bilayer anode, suggesting that reflectivity and functioning as an anode are related to two upper layers of each anode structure.

Figure 7A:
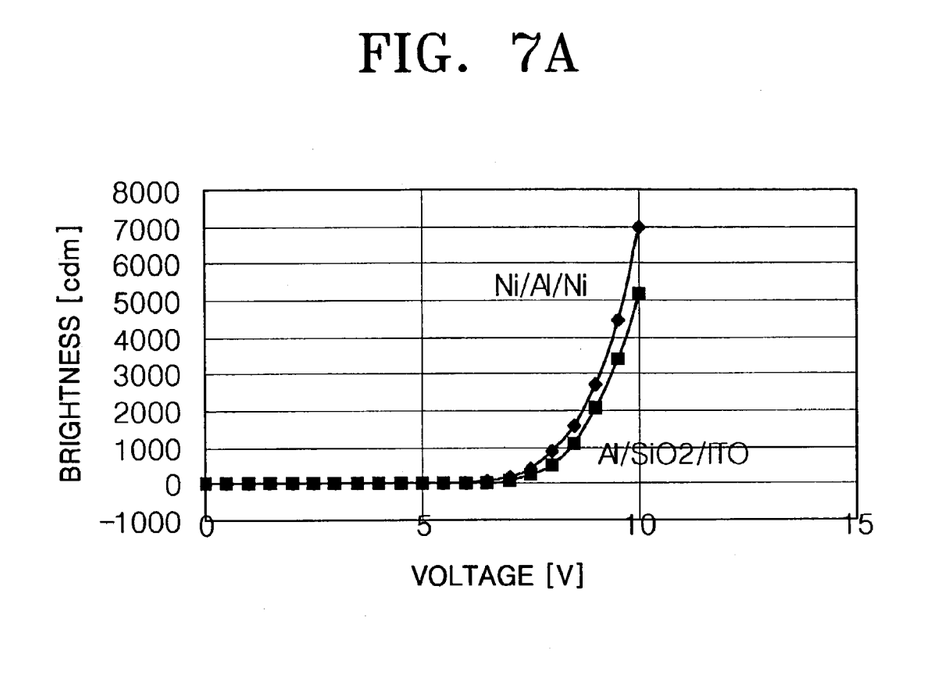
FIGS. 7A and 7B show current-voltage-luminance characteristics and efficiency-luminance characteristics of an organic EL device prepared in Example 1 of the preset invention and Comparative Example 1.
Figure 7B:
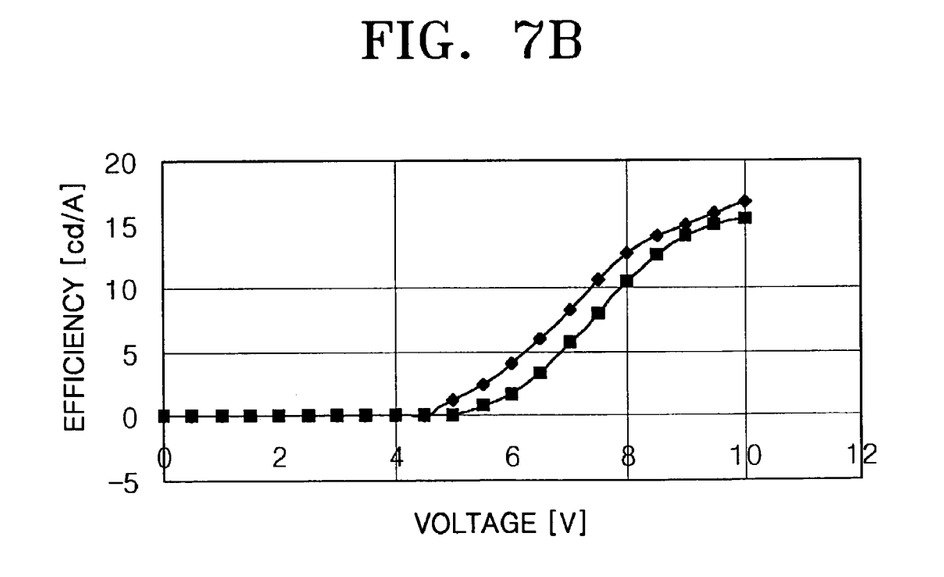

The current-voltage-luminance characteristics of the organic EL devices formed in Example 1 and Comparative Example 1 were examined, and the results are shown in FIGS. 7A and 7B and Table 3.

TABLE 3

|  | Efficiency (cd/A) | Luminance (nit) | Voltage (V) |
| --- | --- | --- | --- |
| Example 1 | 6.8 | 100 | 6.7 |
|  | 11.0 | 500 | 7.6 |
|  | 12.9 | 1000 | 8.1 |
| Comparative | 1.6 | 100 | 7.1 |
| Example 1 | 4.8 | 500 | 8.0 |
|  | 8.1 | 1000 | 8.4 |

Referring to Table 3 and FIGS. 7A and 7B, the organic EL device according to Example 1 had improved efficiency and driving voltage compared to the organic El device of Comparative Example 1, confirming that a multilayered anode serves as an anode and a reflective layer better than the anode of Comparative Example 1.

The organic EL device according to the present invention is a front-emitting type, in which emitted light is transmitted into the front surface thereof rather than into the rear surface that has a low aperture ratio, and has improved emission efficiency by using a multilayered anode having improved hole injecting properties while having a high reflectivity. In particular, an active matrix drive type organic EL device having a built-in TFT has excellent ohmic contact between source/drain electrodes, and a metal structure in the source/drain electrodes is simplified. Also, time and cost required for processing and forming the device may be reduced, thus increasing a yield.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic electroluminescent (EL) device comprising:
a substrate;
a first anode formed on the substrate, made of a reflective metal and having a reflectivity of 60% or higher;
a second anode formed directly on the first anode, and made of a conductive metal or an oxide thereof having a work function of 4.3 to 5.8 eV;
an organic layer formed on the second anode; and
a cathode formed on the organic layer,
wherein the first anode comprises at least one material selected from the group of materials consisting of Al, Al alloy, Ag, Ag alloy and alloys of these materials.

2. The organic EL device according to claim 1, further comprising a third anode made of a conductive metal or an oxide thereof having a work function of 4.3 to 5.8 eV between the substrate and the first anode.

3. The organic EL device according to claim 2, wherein the second anode and the third anode each comprises, independently, at least one material selected from the group consisting of ITO (indium tin oxide), IZO (indium zinc oxide), Ni, Pt, Au, Ir, Cr, Ag and oxides thereof.

4. The organic EL device according to claim 1, wherein the second anode comprises at least one material selected from the group consisting of ITO (indium tin oxide), IZO (indium zinc oxide), Ni, Pt, Au, Ir, Cr, Ag and oxides thereof.

5. The organic EL device according to claim 2, wherein the first anode exhibits a thickness within a range of 50–300 nm, and the second and the third anodes each comprises a same material and exhibits a thickness within a range of 3–30 nm.

6. The organic EL device according to claim 2, wherein the first anode comprises Al, and the second and the third anodes comprise Ni.

7. The organic EL device according to claim 1, wherein the first anode comprises Al, and the second anode comprises Ni.

8. The organic EL device according to claim 1, wherein the cathode is transparent.

9. An organic EL device of an active matrix drive type, comprising:
a substrate;
a thin film transistor formed on the substrate;
an insulator layer formed on the thin film transistor;
a first anode connected to source/drain electrodes of the thin film transistor through a via hole of the insulator layer, wherein the first anode is made of a reflective metal and has a reflectivity of 60% or higher;
a second anode formed directly on the first anode, and made of a conductive metal or an oxide thereof having a work function of 4.3 to 5.8 eV;
an organic layer formed on the second anode; and
a cathode formed on the organic layer,
wherein the first anode comprises at least one material selected from the group of materials consisting of Al, Al alloy, Ag, Ag alloy and alloys of these materials.

10. The organic EL device according to claim 9, further comprising a third anode made of a conductive metal or an oxide thereof having a work function of 4.3 to 5.8 eV between the substrate and the first anode.

11. The organic EL device according to claim 9, wherein the second anode contacting the organic material comprises at least one material selected from the group consisting of ITO (indium tin oxide), Ni, Pt, Au, Ir, Cr, Ag and oxides thereof.

12. The organic EL device according to claim 10, wherein the first anode comprises Al exhibiting a thickness within a range of 50–300 nm, and the second and the third anodes comprise Ni, each exhibiting a thickness within a range of 3–30 nm.

13. The organic EL device according to claim 9, wherein the cathode is transparent.

14. An organic EL device of an active matrix drive type, comprising:
a substrate;
a thin film transistor formed on the substrate;
an insulator layer formed on the thin film transistor;
a third anode connected to source/drain electrodes of the thin film transistor through a via hole of the insulator layer, and made of a conductive metal or an oxide thereof having a work function of 4.3 to 5.8 eV;
a first anode formed directly on the third anode, made of a reflective metal and having a reflectivity of 60% or higher;
a second anode formed directly on the first anode, and made of a conductive metal or an oxide thereof having a work function of 4.3 to 5.8 eV;

an organic layer formed on the second anode; and
a cathode formed on the organic layer,
wherein the first anode comprises at least one material selected from the group of materials consisting of Al, Al alloy, Ag, Ag alloy and alloys of these materials.

15. The organic EL device according to claim 14, wherein the first anode exhibits a thickness within a range of 50–300 nm, and the second and third anodes each exhibits a thickness within a range of 3–30 nm.

16. The organic EL device according to claim 15, wherein the second and the third anode each comprises, independently, at least one material selected from the group consisting of ITO (indium tin oxide), IZO (indium zinc oxide), Ni, Pt, Au, Ir, Cr, Ag and oxides thereof.

17. The organic EL device according to claim 16, wherein the second and the third anodes each comprises a same material.

18. The organic EL device according to claim 15, wherein the first anode comprises Al, and the second and the third anodes comprise Ni.

19. The organic EL device according to claim 14, wherein the cathode is transparent.

* * * * *